United States Patent
Nishi et al.

[11] Patent Number: 5,698,362
[45] Date of Patent: Dec. 16, 1997

[54] 1,2 QUINONE DIAZIDE PHOTOSENSITIVE RESIN COMPOSITION CONTAINING SELECT ADDITIVE AND METHOD FOR FORMING A PHOTORESIST PATTERN

[75] Inventors: Mineo Nishi; Koji Nakano; Makoto Ikemoto; Tadashi Kusumoto; Yasuhiro Kawase, all of Kitakyushu, Japan

[73] Assignee: Mitsubishi Chemical Corporation, Tokyo, Japan

[21] Appl. No.: 818,894

[22] Filed: Mar. 17, 1997

Related U.S. Application Data

[63] Continuation of Ser. No. 521,731, Aug. 31, 1995, abandoned.

[30] Foreign Application Priority Data

Sep. 7, 1994 [JP] Japan ................. 6-213927

[51] Int. Cl.$^6$ ................. G03F 7/023; G03C 1/61
[52] U.S. Cl. ................. 430/191; 430/192; 430/193; 430/311; 430/326
[58] Field of Search ................. 430/165, 191, 430/192, 193, 311, 326

[56] References Cited

U.S. PATENT DOCUMENTS

| 5,204,218 | 4/1993 | Kumada et al. | 430/270 |
|---|---|---|---|
| 5,215,856 | 6/1993 | Jayaraman | 430/165 |
| 5,279,818 | 1/1994 | Nishi et al. | 430/190 |
| 5,372,909 | 12/1994 | Nishi et al. | 430/192 |
| 5,376,498 | 12/1994 | Kajita et al. | 430/191 |
| 5,447,825 | 9/1995 | Nishi et al. | 430/326 |
| 5,456,996 | 10/1995 | Ozaki et al. | 430/191 |
| 5,468,590 | 11/1995 | Hashimoto et al. | 430/191 |

FOREIGN PATENT DOCUMENTS

| 4-330444 | 11/1992 | Japan . |
| 5-323598 | 12/1993 | Japan . |
| 6-3544 | 6/1994 | Japan . |

OTHER PUBLICATIONS

Chemical Abstracts, vol. 120, No. 24, Jun. 13, 1994, Abstract #311598.
Journal of Photopolymer Science and Technology, vol. 4, No. 3, 1991, pp. 318–335.

*Primary Examiner*—Christopher G. Young
*Attorney, Agent, or Firm*—Oblon, Spivak, McClelland, Maier & Neustadt, P.C.

[57] ABSTRACT

A photosensitive resin composition comprising an alkali-soluble resin (A), a compound (B) containing a 1,2-quinonediazide group, and a compound (C) of the following formula (I):

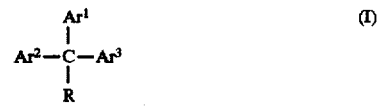

wherein each of $Ar^1$ to $Ar^3$ which are independent of one another, is an aromatic hydrocarbon group which may be substituted by a halogen atom, a $C_{1-4}$ alkyl group or a $C_{1-4}$ alkoxy group, and R is a hydrogen atom, a hydroxyl group, a $C_{1-4}$ alkyl group or a $C_{1-4}$ alkoxy group.

15 Claims, No Drawings

5,698,362

1,2 QUINONE DIAZIDE PHOTOSENSITIVE RESIN COMPOSITION CONTAINING SELECT ADDITIVE AND METHOD FOR FORMING A PHOTORESIST PATTERN

This application is a Continuation of application Ser. No. 08/521,731, filed on Aug. 31, 1995, now abandoned.

The present invention relates generally to a photosensitive resin composition which is sensitive to radiation. Particularly, the present invention relates to an improvement of a photosensitive resin composition comprising an alkali-soluble resin, a compound containing a 1,2-quinonediazide group, and a solvent. More particularly, it relates to a photosensitive resin composition suitable for use under irradiation with light having a wavelength of from 300 to 500 nm.

Along with the recent progress for high integration and high speed of semiconductors, requirements for fine processing techniques used for their production have been increasingly severe. For example, in the case of dynamic random access memory (DRAM), commercial production of products having memory capacity of 16M bits has now been started, and further progress to a higher integration level of 64M bits is expected. Accordingly, requirements for photolithography techniques indispensable for the production of integrated circuits have been increasingly severe. For example, for the production of 4M and 16M DRAMs, lithography techniques of levels of 0.8 μm and 0.5 μm are required, respectively.

Various proposals have been made for such photolithography techniques to attain extremely fine processing. For example, from the optical aspect, the resolution can be improved by improving the performance of a reductive projection lens such as by increasing the numerical aperture (NA) of the lens. However, there is a limit in securing a sufficient exposure area because of restrictions in the preparation of the lens. Further, there is a difficulty such that the depth of focus decreases in exchange for the resolution. On the other hand, a method of using a phase-shifting mask is also known. In this case, the resolution will be improved, but the difficulty in the preparation of such a mask is so severe that the method still remains at a laboratory level. Still further, a mutil-layer process such as a three-layer resist process, has been proposed, but such a process is not practical when mass production of integrated circuits is taken into account. Thus, there has been no process excellent in the productivity, which is comparable to the conventional single layer process. Therefore, a photosensitive resin composition whereby sufficiently high resolution can be attained by a single layer process, is strongly desired.

Further, for the industrial production of integrated circuits, not only the resolution but also various properties have been regarded as important along with refinement of the processing dimension. As an important property required for such a photosensitive resin composition, a so-called "exposure margin" may, for example, be mentioned. Here, the exposure margin is an allowance for the fluctuation in the line width against the change in exposure. At the commercial production site of integrated circuits, fluctuation in exposure occurs commonly due to a control error of the exposure equipment, an influence of the substrate for the photoresist film or a level difference in the substrate for the photoresist film, and such occurrence is unavoidable. This fluctuation in exposure causes a dimensional failure which is fatal to the production of normal integrated circuits. The "exposure margin" indicates the degree of rareness of such occurrence. Specifically, it can be evaluated by $\Delta ACD/\Delta\log Exp.$ (wherein ACD represents the change in the line width, and Exp. represents quantity of light of the exposure (hereinafter referred to as "exposure")) i.e. an inclination of the fluctuation in the line width against the change in exposure in the vicinity of the practical sensitivity $E_0$ of the photoresist composition ($E_0$ being the exposure whereby the finished dimension after development of the photoresist composition becomes the same as the designed dimension of the mask, i.e. the exposure whereby the ratio of the line width to the line space of the finished pattern dimension after developing a photoresist film exposed through a mask having a pattern of a desired dimension with the ratio of the line width:line space being 1:1, would be 1:1). Namely, if $\Delta CD/\Delta\log Exp.$ is large, the line width changes substantially even by a small change in the quantity of light actually irradiated to a photoresist film under a practical exposure condition, whereby dimensional failure undesirable for the production of normal integrated circuits, will result. Inversely, if $\Delta ACD/\Delta\log Exp.$ is sufficiently small, the dimensional change due to the change in exposure will be small, whereby the production of integrated circuits can be conducted under a stabilized condition. Accordingly, it is desired that $\Delta CD/\Delta\log Exp.$ is as small as possible.

Further, the depth of focus indicating an allowance for fluctuation in the line width or the pattern profile against a change in focus, is also one of important factors. In actual integrated circuits, a deviation in focus occurs at the time of exposure due to a stepper or by an influence of a level difference of the substrate for a photoresist film, whereby there will be a change in the pattern profile or a dimensional change. If the depth of focus is large, the change in the pattern profile or the dimensional change will be small even when a deviation in focus occurs. However, if the depth of focus is small, a substantial change in the pattern profile or a substantial dimensional change will result even by a small deviation in focus. Accordingly, in order to prepare integrated circuits under a stabilized condition, a photosensitive resin composition excellent in the depth of focus is required.

Further, when an additive is incorporated, it may happen that fine particles will be formed, or the sensitivity will change during the storage of the photosensitive resin composition. Accordingly, when an additive is to be used, it is required that the storage stability is good.

Further, the pattern profile is one of the important factors. The pattern profile is desired to be perpendicular to the wafer substrate. If the pattern profile is other than this, i.e. if the pattern profile flares or bites in the vicinity of the substrate for the resist, there will be a problem that at the time of removing unnecessary portions of the resist with an etchant in an etching step which is one of steps for producing semiconductor devices, a predetermined width dimension can not be obtained.

Japanese Unexamined Patent Publication No. 330444/1992 discloses a photosensitive resin composition containing a triphenylmethanol and a compound which is curable or decomposable under a basic condition. In the composition of this publication, the triphenylmethanol is employed as a compound which generates a base under irradiation with a radiation, and by the action of the generated base, there will be a difference in the solubility of the photosensitive resin composition in the developing solution. However, the same publication does not disclose that the photosensitive resin composition contains a compound having a 1,2-quinonediazide group.

Japanese Unexamined Patent Publication No. 323598/1993 discloses a positive photosensitive resin composition containing 1,1,2,2-tetraphenyl-1,2-ethanediol. The same publication discloses use of a certain specific diol as an additive for high resolution, but it does not disclose use of an alcohol having a triphenylmethyl group structure.

Japanese Examined Patent Publication No. 3544/1994 discloses a positive radiation-sensitive resist composition containing a polyphenol. The polyphenol in the publication contains at least one phenolic hydroxyl group on an aromatic ring, but the solubility of such a compound in an aqueous alkaline solution, is substantially different from a compound having no hydroxyl group on an aromatic ring. This publication does not disclose any compound having no hydroxyl group on an aromatic ring.

Japanese Unexamined Patent Publication No. 104473/1995 discloses a radiation-sensitive composition comprising a secondary or tertiary alcohol containing a plurality of aromatic rings. The same publication discloses that a secondary or tertiary alcohol having a hydroxyl group on carbon directly bonded to the aromatic ring is converted to a compound showing an effect for suppressing the solubility to an aqueous alkaline solution, by the reaction using an acid as a catalyst. The triphenylmethane derivatives disclosed in the same publication can be converted to a substance showing the effect for suppressing the solubility, by the acid catalyst. Whereas, the substituent of the phenyl group of the present triphenylmethanes have no hydroxy group on carbon bonded to an aromatic ring, and the triphenylmethanes of the present invention will not be converted to compounds showing effects for suppressing the solubility to an alkali, by acid catalysts. Namely, the triphenylmethanes disclosed in the publication are different in the structure and the effects from triphenylmethanes used in the present invention.

Under the above-mentioned circumstances, it is an object of the present invention to provide a photosensitive resin composition which has high resolution and is excellent in the exposure margin and the depth of focus and which is good in the storage stability and the pattern profile.

The present inventors have conducted extensive researches to solve the above-mentioned problems and as a result, have found that a photosensitive resin composition containing a certain specific compound has high resolution and is excellent in the exposure margin, the depth of focus and the pattern profile and good in the storage stability. On the basis of this discovery, the present invention has been accomplished.

Namely, the present invention provides a photosensitive resin composition comprising an alkali-soluble resin (A), a compound (B) containing a 1,2-quinonediazide group, and a compound (C) of the following formula (I):

(I)

wherein each of $Ar^1$ to $Ar^3$ which are independent of one another, is an aromatic hydrocarbon group which may be substituted by a halogen atom, a $C_{1-4}$ alkyl group or a $C_{1-4}$ alkoxy group, and R is a hydrogen atom, a hydroxyl group, a $C_{1-4}$ alkyl group or a $C_{1-4}$ alkoxy group.

Now, the present invention will be described in detail with reference to the preferred embodiments.

The most important feature of the present invention is that the photosensitive resin composition contains the compound (C) of the above formula (I). Each of $Ar^1$ to $Ar^3$ which may be the same or different, is an aromatic hydrocarbon group which may be substituted by a halogen atom, a $C_{1-4}$ alkyl group or a $C_{1-4}$ alkoxy group. The $C_{1-4}$ alkyl group may, for example, be methyl, ethyl, propyl or butyl. The $C_{1-4}$ alkoxy group may, for example, be methoxy, ethoxy, propoxy or butoxy. The halogen atom may, for example, be chlorine or bromine. Among these substituents, a halogen atom, a $C_{1-2}$ alkyl group or a $C_{1-2}$ alkoxy group is preferred. The aromatic hydrocarbon group may, for example, be a phenyl group, a 1-naphthyl group or a 2-naphthyl group, preferably a phenyl group. Among those mentioned above, the aromatic hydrocarbon group for $Ar^1$ to $Ar^3$ is most preferably a non-substituted aromatic hydrocarbon group. On the other hand, R is a hydrogen atom, a hydroxyl group, a $C_{1-4}$ alkyl group or a $C_{1-4}$ alkoxy group. The carbon number of the alkyl and alkoxy groups is preferably 1 or 2, and R is particularly preferably a hydrogen atom or a hydroxyl group. The compound of the formula (I) is clearly distinguished from the compounds disclosed in Japanese Examined Patent Publication No. 3544/1994 in that it does not have a hydroxyl group as a substituent on an aromatic hydrocarbon group. Specifically, the compound of the formula (I) may, for example, be α,α-diphenyl-benzyl alcohol, 2-bromo-α,α-diphenyl-benzyl alcohol, 4-bromo-α,α-diphenyl-benzyl alcohol, 2-chloro-α,α-diphenyl-benzyl alcohol, 3-chloro-α,α-diphenyl-benzyl alcohol, 4-chloro-α,α-diphenyl-benzyl alcohol, 4-chloro-α-(4-chlorophenyl)-α-phenyl-benzyl alcohol, 3-chloro-α,α-bis(3-chlorophenyl)-benzyl alcohol, 4-chloro-α,α-bis(4-chlorophenyl)-benzyl alcohol, 2-methyl-α,α-diphenyl-benzyl alcohol, 4-methyl-α,α-diphenyl-benzyl alcohol, 2-methyl-α,α-bis(2-methylphenyl)-benzyl alcohol, 3-methyl-α,α-bis(3-methylphenyl)-benzyl alcohol, 4-methyl-α,α-bis(4-methylphenyl)-benzyl alcohol, 2-methoxy-α,α-diphenyl-benzyl alcohol, 4-methoxy-α,α-diphenyl-benzyl alcohol, 3,4-dimethoxy-α,α-diphenyl-benzyl alcohol, 2-methoxy-α-(2-methoxyphenyl)-α-phenyl-benzyl alcohol, 4-methoxy-α-(4-methoxyphenyl)-α-phenyl-benzyl alcohol, 2-methoxy-α,α-bis(2-methoxyphenyl)-benzyl alcohol, 4-methoxy-α,α-bis(4-methoxyphenyl)-benzyl alcohol, α-(2,4-dimethoxyphenyl)-2,4-dimethoxy-α-(2-methoxyphenyl)-benzyl alcohol, α-(2,4-dimethoxyphenyl)-2,4-dimethoxy-α-(4-methoxyphenyl)-benzyl alcohol, α,α-bis(2,4-dimethoxyphenyl)-2,4-dimethoxy-benzyl alcohol, α,α-bis(2,4-dimethoxyphenyl)-2,4,6-trimethoxy-benzyl alcohol, triphenyl-methane, 2-methylphenyl-diphenyl-methane, 4-methylphenyl-diphenyl-methane, tris(2-methylphenyl)-methane, tris(3-methylphenyl)methane, tris(4-methylphenyl)methane, 2-methoxyphenyl-diphenyl-methane, 4-methoxyphenyl-diphenyl-methane, 3,4-dimethoxyphenyl-diphenyl-methane, bis(2-methoxyphenyl)-phenyl-methane, bis(4-methoxyphenyl)-phenyl-methane, tris(2-methoxyphenyl)-methane, tris(4-methoxyphenyl)-methane, bis(2,4-dimethoxyphenyl)-2-methoxyphenyl-methane, bis(2,4-dimethoxyphenyl)-4-methoxyphenyl-methane, tris(2,4-dimethoxyphenyl)-methane, bis(2,4-dimethoxyphenyl)-2,4,6-trimethoxyphenyl-methane, triphenyl-methyl-methane, 2-methylphenyl-diphenyl-methyl-methane, 4-methylphenyl-diphenyl-methyl-methane, tris(2-methylphenyl)-methyl-methane, tris(3-methylphenyl)-methyl-methane, tris(4-methylphenyl)-methyl-methane, 2-methoxyphenyl-diphenyl-methyl-methane, 4-methoxyphenyl-diphenyl-methyl-methane, 3,4-dimethoxyphenyl-diphenyl-methyl-methane, bis(2-methoxyphenyl)-phenyl-methyl-methane, bis(4-methoxyphenyl)-phenyl-methyl-methane, tris(2-methoxyphenyl)-methyl-methane, tris(4-methoxyphenyl)-methyl-methane, bis(2,4-dimethoxyphenyl)-2-methoxyphenyl-methyl-methane, bis(2,4-dimethoxyphenyl)-4-methoxyphenyl-methyl-methane, tris(2,4-dimethoxyphenyl)-methyl-methane, bis(2,4-dimethoxyphenyl)-2,4,6-trimethoxyphenyl-methylmethane, triphenyl-methoxy-methane, 2-methylphenyl-diphehyl-methoxy-methane, 4-methylphenyl-diphehyl-methoxy-methane, tris(2-methylphenyl)-methoxy-methane, tris(3-methylphenyl)-methoxy-methane, tris(4-methylphenyl)-methoxy-methane, 2-methoxyphenyl-diphenyl-methoxy-methane, 4-methoxyphenyl-diphenyl-methoxy-methane, 3,4-dimethoxyphenyl-diphenyl-methoxy-methane, bis(2-methoxyphenyl)-phenyl-methoxy-methane, bis(4-methoxyphenyl)-phenyl-methoxy-methane, tris(2-methoxyphenyl)-methoxy-methane, tris(4-methoxyphenyl)-methoxy-methane, bis(2,4-dimethoxyphenyl)-2-methoxyphenyl-methoxy-methane, bis(2,4-dimethoxyphenyl)-4-methoxyphenyl-methoxy-methane, tris(2,4-dimethoxyphenyl)-methoxy-methane, or bis(2,4-dimethoxyphenyl)-2,4,6-trimethoxyphenyl-methoxy-methane. As the compound (C), a compound of the above formula (I) may be used alone, or a plurality of compounds of the above formula (I) having structures different from one another, may be used in combination as a mixture. Further, the blend ratio of the compound (C) to the total solid content of the photosensitive resin composition i.e. [C/(A+B+C)]×100 (%) is usually preferably at a level of from 0.1 wt % to 3 wt %. The lower limit is particularly preferably at least 0.4 wt %. Whereas, the upper limit is preferably at most 1.5 wt %. If this blend ratio is too small, the effects will be inadequate, and if it is too large, there will be an adverse effect to the heat resistance, such being undesirable.

As the alkali-soluble resin (A) to be used in the present invention, various conventional alkali-soluble resins may be used. Specifically, a novolak resin, a polyhydroxylstyrene or its derivative, and a styrene-maleic anhydride copolymer may, for example, be mentioned. Preferred is a novolak resin, a polyhydroxystyrene or its derivative, and particularly preferred is a novolak resin.

The novolak resin can be obtained usually by polycondensation of a hydroxy aromatic compound with a carbonyl compound. Such a hydroxy aromatic compound may, for example, be phenol, an alkylphenol such as o-cresol, m-cresol, p-cresol, 3-ethylphenol, 2,5-xylenol or 3,5-xylenol, an alkoxy or aryloxyphenol such as 2-methoxyphenol, 4-methoxyphenol or 4-phenoxyphenol, a naphthol such as α-naphthol, β-naphthol or 3-methyl-α-naphthol, or a polyhydroxybenzene such as 1,3-dihydroxybenzene, 1,3-dihydroxy-2-methylbenzene, 1,2,3-trihydroxybenzene, 1,2,3-trihydroxy-5-methylbenzene or 1,3,5-trihydroxybenzene. The above-mentioned carbonyl compound may, for example, be an aliphatic aldehyde such as formaldehyde, paraformaldehyde, acetaldehyde or paraldehyde, an aromatic aldehyde such as benzaldehyde, or an alkyl ketone such as acetone. The polycondensation is carried out by mixing the above-mentioned hydroxy aromatic compound with the above-mentioned carbonyl compound and heating in the presence of a catalyst. As such a catalyst, hydrochloric acid, sulfuric acid or oxalic acid may, for example, be mentioned. The molar ratio of the carbonyl compound to the hydroxy aromatic compound is usually from 0.5 to 1.0, preferably from 0.6 to 0.9. A preferred novolak resin may be the one produced by mixing and heating for polycondensation in the presence of hydrochloric acid, oxalic acid or the like as a catalyst, at least one member selected from the group consisting of m-cresol, p-cresol, 2,5-xylenol and 3,5-xylenol and at least one member selected from the group consisting of formaldehyde, acetaldehyde and paraldehyde. Particularly preferred is the one produced by mixing and heating for polycondensation in the presence of hydrochloric acid, oxalic acid and or the like as a catalyst, m-cresol, p-cresol and 2,5-xylenol, with formaldehyde alone or with formaldehyde and acetaldehyde or paraldehyde. In such a combination, improvement in the resolution is particularly remarkable. In this case, the molar ratio of the cresols to 2,5-xylenol is usually from 10/0 to 5/5, preferably from 10/0 to 7/3. Especially, a mixture comprising m-cresol, p-cresol and 2,5-xylenol in a molar ratio of 2-6/2-6/1-4 is preferred, wherein total mol ratio is 10. And molar ratio of formaldehyde/acetaldehyde or paraldehyde is usually 10/0-5/5, preferably is 95/5-50/50, more preferably is 90/10-60/40. The weight average molecular weight as calculated as polystyrene (hereinafter referred to simply as the molecular weight) of the above novolak resin is preferably at most 30,000, more preferably at most 20,000, and it is preferably at least 2,500, more preferably at least 3,000. If the molecular weight is too low, deterioration in the heat resistance of the photoresist composition will be remarkable, and if it is too high, deterioration in the sensitivity will be remarkable, such being undesirable for the production of integrated circuits under a stabilized condition.

The polyhydroxylstyrene or its derivative can be prepared by polymerizing a hydroxystyrene derivative such as 4-hydroxystyrene, 3-methyl-4-hydroxystyrene or 3-chloro-4-hydroxystyrene in accordance with a conventional method. If necessary, the obtained alkali-soluble resin may further be reduced by e.g hydrogen to lower the light absorption in a short wavelength region. The aromatic compound monomer to be used for the production of such an alkali soluble resin, may have a substituent such as a halogen atom, a nitro group or an ester group, so long as such a substituent presents no adverse effects to the present invention.

In the present invention, a compound (B) containing a 1,2-quinonediazide group is used as a photosensitive compound.

The compound containing a 1,2-quinonediazide group may include various compounds containing in their structures a 1,2-quinonediazide group. However, it is usually preferably an ester or amide of e.g. 1,2-benzoquinonediazide-4-sulfonic acid, 1,2-naphthoquinonediazide-4-sulfonic acid or 1,2-naphthoquinonediazide-5-sulfonic acid. More specifically, it may, for example, be an ester or amide of 1,2-benzoquinonediazide-4-sulfonic acid, 1,2-naphthoquinonediazide-4-sulfonic acid or 1,2-naphthoquinonediazide-5-sulfonic acid, of a polyhydroxyalkyl compound such as glycerol or pentaerythritol, or a polyhydroxy aromatic compound such as bisphenol A, a gallic acid ester, kercetin, morin, a polyhydroxybenzophenone or the above-mentioned novolak resin which is a polycondensation product of a hydroxy aromatic compound with a carbonyl compound, as mentioned above with respect to the alkali-soluble resin. The polyhydroxybenzophenone may, for example, be 2,3,4-trihydroxybenzophenone, 2,3,4,4'-tetrahydroxybenzophenone, 2,3,4,2',4'-pentahydroxybenzophenone or 2,3,4,3',4',5'-hexahydroxybenzophenone. These compounds containing 1,2-quinonediazide groups, may be used alone or in combination as a mixture of two or more of them. Among them, preferred is a 1,2-naphthoquinonediazide-5-sulfonic acid ester of a novolak resin having a molecular weight of at most 2,500 or of a polyhydroxybenzophenone. Particularly preferred is a 1,2-naphthoquinonediazide-5-sulfonic acid ester of a novolak resin prepared by polycondensation of m-cresol with formaldehyde and/or acetaldehyde, or of 2,3,4-trihydroxybenzophenone, 2,3,4,4'- tetrahydroxybenzophenone or 2,3,4,2',4'-pentahydroxybenzophenone. The types and the blend ratio for polycondensation of the hydroxy aromatic compound and the carbonyl compound to be used for the preparation of this novolak resin, may be basically the same as described with respect to the novolak resin for the above alkali-soluble resin. However, the weight average molecular weight as calculated as polystyrene, of the novolak resin used for preparing a compound containing a 1,2-quinonediazide group, is preferably from 600 to 2,200, more preferably from 700 to 1,500. The preferred range of the substitution ratio by esterification of hydroxyl groups of these photosensitive compounds, varies depending upon the types of the photosensitive compounds. However, with respect to the esterification product of the novolak resin, the substitution ratio is preferably from 25 to 70%. With respect to the esterification product of the polyhydroxybenzophenone, the substitution ratio is preferably from 50 to 95%. If this substitution ratio is too low, the resolution of the photoresist composition tends to be poor. On the other hand, if it is too high, the deterioration in the sensitivity tends to be remarkable. Further, a naphthoquinonediazide sulfonic acid ester of a compound having a phenolic hydroxyl group, as disclosed in e.g. Japanese Unexamined Patent Publication No. 269351/1990 or No. 48249/1991, may be used as a photosensitive compounds.

The photosensitive resin composition of the present invention may contain a photosensitive compound other than the compound containing a 1,2-quinonediazide group to such an extent not to impair the performance.

Preparation of the photosensitive resin composition of the present invention is carried out usually by mixing and dissolving the alkali-soluble resin (A), the compound (B) containing a 1,2-quinonediazide group and the compound (C) of the formula (I) in a suitable solvent.

The solvent to be used for the preparation of the photosensitive resin composition of the present invention may, for example, be a glycol acid ester derivative such as methyl lactate, ethyl lactate or ethyl glycolate, a glycol ether ester derivative such as ethyl cellosolve acetate, methyl cellosolve acetate or propylene glycol monomethyl ether acetate, a ketone ester such as methyl pyruvate or ethyl pyruvate, an alkoxycarboxylic acid ester such as methyl 3-methoxypropionate, ethyl 3-ethoxypropionate or methylethoxy propionate, a ketone derivative such as acetyl acetone, cyclopentanone, cyclohexanone or 2-heptanone, a ketone ether derivative such as diacetone alcohol methyl ether, a ketone alcohol derivative such as acetol or diacetone alcohol, an amide derivative such as dimethylacetamide or dimethylformamide, or an ether derivative such as anisole or diethylene glycol dimethyl ether. Further, a solvent mixture having xylene or butyl acetate added, may also be used, as the case requires. Among them, methyl 3-methoxypropionate, methylethoxy propionate, methyl amyl ketone or a solvent mixture comprising methyl lactate and ethyl lactate as the main components, is preferred from the viewpoint of the storage stability, the uniformity of the film, the safety and the handling efficiency, and particularly preferred is methyl 3-methoxypropionate, or a solvent mixture of ethyl lactate with propylene glycol monomethyl ether acetate or butyl acetate. In this case, the mixing weight ratio is usually from 10/0 to 5/5, preferably from 9/1 to 7/3.

The concentration of the alkali-soluble resin in the photosensitive resin composition of the present invention is usually from 1 to 40 wt %, preferably from 10 to 30 wt %. The concentration of the compound containing a 1,2-quinonediazide group is usually from 1 to 30 wt %, preferably from 5 to 20 wt %. Further, the proportion of the photosensitive compound containing 1,2-quinonediazide group to the solid content of the photoresist composition is usually from 15 to 60 wt %, preferably from 25 to 45 wt %.

Further, to the photosensitive resin composition of the present invention, a surfactant may be added to improve the coating properties. Among surfactants, a fluorine type surfactant is preferred. The amount of such a surfactant is preferably at most 2,000 ppm, relative to the photosensitive resin composition containing the solvent. Further, a light-absorbing material to reduce the influence of scattered reflected lights from the substrate and a sensitizer to improve the sensitivity may further be incorporated. To prepare a photosensitive resin composition by mixing the above-described constituting components, the above-mentioned compound (C) may firstly be dissolved in the solvent, and then other components may be mixed thereto. Otherwise, components other than the compound (C) may be mixed and dissolved in the solvent, and then compound (C) may be mixed thereto. In the production of integrated circuits, materials used are desired to contain impurities such as trace amounts of metals and halogens as little as possible. Also with respect to the photosensitive resin composition, the respective constituting components may be purified by ion exchange methods, respectively, to improve the purity, before mixing to obtain a photosensitive resin composition. Otherwise, the respective constituting components may be mixed to prepare a photosensitive resin composition, which is then purified by an ion exchange method before use. When it is practically used for the production of integrated circuits, it is common to subject it to filtration by means of a filter with pores of submicron sizes.

As a radiation to be applied to the photosensitive composition of the present invention, a light with a wavelength of 300 to 500 nm such as g-line (436 nm) or i-line (365 nm), is preferably employed.

A conventional method may be employed for forming a pattern by means of the photosensitive resin composition of the present invention. Namely, a pattern is formed by a process comprising coating of the photosensitive resin composition on a substrate, followed by steps of exposure, development, etc.

The substrate may be a silicon wafer or the one having various materials, such as silicon dioxide, polysilicon, silicide, silicon nitride or aluminum, coated in a single layer structure or in a laminated structure thereon.

The coating can be conducted by e.g. spin coating, spray coating or roll coating. However, in the process for producing integrated circuits, a high level of uniformity of the coated film thickness is required, and therefore coating is preferably conducted by a spin coating method. Usually, after the coating, the substrate is heated on e.g. a hot plate to remove the solvent, followed by exposure through a mask to form a desired pattern on the substrate.

As a developing solution, a basic aqueous solution of e.g. ammonia, triethylamine, dimethylaminomethanol, tetramethylammonium hydroxide, sodium hydroxide, potassium hydroxide, sodium carbonate, potassium carbonate or trimethylhydroxyethylammonium hydroxide, is employed, and its concentration is preferably within a range of from 1 to 30%. Further, a surfactant or an alcohol may be added to the above developing solution.

The photosensitive resin composition of the present invention has excellent pattern profile and high resolution and is excellent in the depth of focus, and at the same time it is excellent in the exposure margin and the removal margin. Therefore, it is useful as a photoresist for preparation of integrated circuits, particularly for fine processing.

Now, the present invention will be described in further detail with reference to Examples. However, it should be understood that the present invention is by no means restricted by such specific Examples. In the following Examples, the molecular weight means a weight average molecular weight (analytical value calculated as polystyrene by gel permeation chromatography).

EXAMPLE 1

1.486 Parts by weight of a novolak resin (A1) (molecular weight: 4,500) prepared from m-cresol/p-cresol/2,5-xylenol (molar ratio of 5/4/1) and formaldehyde/acetaldehyde (molar ratio of 8/2), 1 part by weight of an esterification product (B1) (esterification ratio: 47%) of 1,2-naphthoquinonediazide-5-sulfonic acid with a condensate (molecular weight: 600) of m-cresol and formaldehyde/acetaldehyde (molar ratio of 8/2), and 0.025 part by weight of triphenylmethanol (C1) as the compound (C) of the formula (I), were dissolved in 7.64 parts by weight of methyl 3-methoxypropionate. This solution was subjected to precision filtration by means of a Teflon filter with pores of 0.2 μm, to obtain a photoresist composition. The composition was evaluated by the following methods.

EVALUATION METHOD 1

The photoresist composition was coated on a silicon wafer by a spin coater, followed by heating on a hot plate of 80° C. for 90 seconds to remove the solvent and to form a photoresist coating film having a thickness of 0.855 μm. This coated wafer was subjected to exposure by an i-line stepper (NA=0.50) manufactured by Nikon and then heated on a hot plate of 110° C. for 90 seconds. Then, it was immersed in a 2.38% tetramethylammonium hydroxide aqueous solution for 60 seconds for development. The cross-sectional profile of the formed pattern was observed by an electron microscope, whereby the sensitivity $E_c$ (the minimum exposure required till a pattern of 0.5 μm line width/line space is removed to the substrate), the sensitivity $E_0$ (the exposure whereby a pattern of 0.5 μm line width/line space can be finished at 1:1), $E_0/E_c$ (the removal margin within which a pattern of 0.5 μm line width/line space can be obtained), the resolution (the minimum pattern size of the line width/line space pattern which can be dissolved by exposure whereby a pattern of 0.5 μm line width/line space will be finished at 1:1), and the depth of focus (the fluctuation (μm) in focus in a case where, when exposure is conducted with the quantity of exposure such that a pattern of 0.5 μm line width/line space can be finished at 1:1, the resist is removed to the substrate, as observed from above), exposure margin (ΔCD/ΔlogExp.), were evaluated. The results are shown in Table 2.

EXAMPLE 2

A photoresist composition was prepared and evaluated in the same manner as in Example 1 except that in Example 1, a novolak resin (A2) was used which was the same as the novolak resin (A1) except that the molecular weight was 4,000, and the preparation was carried out with the compositional ratios as identified in Table 1. The results are shown in Table 2.

EXAMPLE 3

A photoresist composition was prepared and evaluated in the same manner as in Example 1 except that a novolak resin (A3) was used which was the same as the novolak resin (A1) except that the molecular weight was 3,500, and the preparation was carried out with the compositional ratios as identified in Table 1. The results are shown in Table 2.

COMPARATIVE EXAMPLE 1

A photoresist composition was prepared and evaluated in the same manner as in Example 1 except that in Example 1, no triphenylmethanol was used, and the preparation was carried out with the compositional ratios as identified in Table 1. The results are shown in Table 2.

Further, the storage stability was good in each case.

TABLE 1

| | Component (A) | | Component (B) (parts by weight) | Component (C) (parts by weight) | Solvent (parts by weight) | $\frac{C}{A+B+C} \times 100\,(\%)$ |
|---|---|---|---|---|---|---|
| | Type | (parts by weight) | | | | |
| Example 1 | A1 | 1.486 | 1 | 0.025 | 7.64 | 1.0 |
| Example 2 | A2 | 1.498 | 1 | 0.013 | 7.64 | 0.5 |
| Example 3 | A3 | 1.486 | 1 | 0.025 | 7.64 | 1.0 |
| Comparative Example 1 | A1 | 1.511 | 1 | — | 7.64 | — |

TABLE 2

| | $E_c$ (msec) | $E_0$ (msec) | $E_0/E_c$ | $\frac{\Delta CD}{\Delta logExp.}$ | Resolution (μm) | Depth of focus (μm) |
|---|---|---|---|---|---|---|
| Example 1 | 500 | 716 | 1.43 | 0.73 | 0.38 | 2.2 |
| Example 2 | 390 | 543 | 1.39 | 0.94 | 0.38 | 2.4 |
| Example 3 | 390 | 531 | 1.36 | 0.78 | 0.38 | 2.2 |
| Comparative Example 1 | 400 | 540 | 1.35 | 1.00 | 0.40 | 2.0 |

COMPARATIVE EXAMPLES 2 AND 3

2.0 g of the same novolak resin as used in Example 1, 0.1 g (Comparative Example 2) or 0.2 g (Comparative Example 3) of triphenylmethanol and 1.0 g of bis(4-p-tert-butoxycarbonyl)bisphenol A were dissolved in 10 ml of methyl 3-methoxypropionate, and this solution was subjected to precision filtration by means of a Teflon filter with pores of 0.2 μm, to obtain a photoresist composition. The composition was coated on a silicon wafer and heated on a hot plate of 80° C. for 90 seconds to remove the solvent and to form a photoresist coating film having a thickness of 0.9 μm. These coated wafers were subjected to exposure by an i-line stepper (NA=0.50) manufactured by Nikon by changing the exposure energy from 20 to 260 mJ/cm² and then heated on a hot plate of 110° C. for 90 seconds. Then, they were immersed in a 2.38% tetramethylammonium hydroxide aqueous solution for 60 seconds for development.

However, no pattern was resolved in either case. These results mean that in the case of exposure by the i-line, no image was formed when a photoresist doesn't contain a photosensitive compound containing a 1,2-quinonediazide group.

EXAMPLE 4

8.072 Parts by weight of a novolak resin (A4) (molecular weight: 2,700) prepared from m-cresol/p-cresol/2,5-xylenol (molar ratio of 5/4/1) and formaldehyde/paraldehyde (molar ratio of 8/2), 3.603 parts by weight of an esterification product (B2) (esterification ratio: 40%) of 1,2-naphthoquinonediazide-5-sulfonic acid with a condensate (molecular weight: 1,000) of m-cresol and acetaldehyde, 1,000 parts by weight of an esterification product (B3) (esterification ratio: 25%) of 1,2-naphthoquinonediazide-5-sulfonic acid with a condensate (molecular weight: 1,100) of m-cresol and acetaldehyde and 0.128 parts by weight of triphenylmethanol (C1) as the compound (C) of the formula (I), were dissolved in a mixture comprising 28.3 parts by weight of ethyl lactate and 12.2 parts by weight of propylene glycol monomethyl ether acetate. The solution was subjected to precision filtration by means of a Teflon filter with no triphenylmethanol was used, a novolak resin (A5) (molecular weight: 3,700) prepared with the same blend ratios as in Example 4, was used as the novolak resin, and preparation was carried out with the compositional ratios as identified in Table 3. The results are shown in Table 4.

COMPARATIVE EXAMPLE 5

A photoresist composition was prepared and evaluated in the same manner as in Example 4, except that tris(p-hydroxyphenyl)methane (L) was used instead of triphenylmethanol, and a novolak resin (A5) (molecular weight: 3,700) prepared with the same blend ratios as in Example 4, was used as the novolak resin. The results are shown in Table 4.

TABLE 3

| | Component (A) | | Component (B) | | | | Additive | | Solvent | | |
| --- | --- | --- | --- | --- | --- | --- | --- | --- | --- | --- | --- |
| | Type | (parts by weight) | Type | (parts by weight) | Type | (parts by weight) | Type | (parts by weight) | (parts by weight) | $\frac{\text{Additive}}{\text{A + B + Additive}} \times 100\ (\%)$ | |
| Example 4 | A4 | 8.072 | B2 | 3.603 | B3 | 1 | C1 | 0.128 | 40.5 | 1.0 | |
| Comparative Example 4 | A5 | 8.200 | B2 | 3.603 | B3 | 1 | — | — | 4.05 | — | |
| Comparative Example 5 | A5 | 8.072 | B2 | 3.603 | B3 | 1 | L | 0.128 | 40.5 | 1.0 | |

TABLE 4

| | $E_{th}$ (msec) | $E_c$ (msec) | $E_0$ (msec) | $E_0/E_c$ | $\frac{\Delta CD}{\Delta \log Exp.}$ | Resolution (μm) | Depth of focus (μm) |
| --- | --- | --- | --- | --- | --- | --- | --- |
| Example 4 | 204 | 250 | 389 | 1.56 | 0.94 | 0.32 | 2.4 |
| Comparative Example 4 | 194 | 240 | 375 | 1.56 | 0.97 | 0.34 | 2.1 |
| Comparative Example 5 | 188 | 250 | 377 | 1.51 | 1.02 | 0.34 | 2.0 | pores of 0.2 μm, to obtain a photoresist composition. The composition was evaluated by the following methods.

EVALUATION METHOD 2

The photoresist composition was coated on a silicon wafer by means of a spin coater and heated on a hot plate of 80° C. for 70 seconds to remove the solvent and to form a photoresist coating film having a thickness of 1.07 μm. This coated wafer was subjected to exposure by an i-line stepper (NA=0.50) manufactured by Nikon and then heated on a hot plate of 110° C. for 70 seconds and then immersed in a 2.38% tetramethylammonium hydroxide aqueous solution for 60 seconds for development. The formed pattern was evaluated in the same manner as in Evaluation Method 1. The results are shown in Table 4.

COMPARATIVE EXAMPLE 4

A photoresist composition was prepared and evaluated in the same manner as in Example 4 except that in Example 4,

EXAMPLE 5

1.218 Parts by weight of a novolak resin (A6) (molecular weight: 3,000) prepared from m-cresol/p-cresol/2,5-xylenol (molar ratio of 5/4/1) and formaldehyde/acetaldehyde (molar ratio of 8/2), 0.317 part by weight of an esterification product (B2) (esterification ratio: 40%) of 1,2-naphthoquinonediazide-5-sulfonic acid with a condensate (molecular weight: 1,000) of m-cresol and acetaldehyde, 1,000 parts by weight of an esterification product (B3) (esterification ratio: 25%) of 1,2-naphthoquinonediazide-5-sulfonic acid with a condensate (molecular weight: 1,100) of m-cresol and acetaldehyde and 0.026 part by weight of triphenylmethane (C2) as the component (C) of the formula (I), were dissolved in 5.68 parts by weight of ethyl lactate and 2.43 parts by weight of propylene glycol monomethyl ether acetate. This solution was subjected to precision filtration by means of a Teflon filter with pores of 0.2 μm, to obtain a photoresist composition. This composition was evaluated by the following method.

EVALUATION METHOD 3

The photoresist composition was coated on a silicon wafer by a spin coater and then heated on a hot plate of 90° C. for 60 seconds to remove the solvent and to form a photoresist coating film having a thickness of 1.07 μm. This coated wafer was subjected to exposure by an i-line stepper (NA=0.50) manufactured by Nikon and then heated on a hot plate of 110° C. for 60 seconds. Then, it was immersed in a 2.38% tetramethylammonium hydroxide aqueous solution for 60 seconds for development. With respect to the formed pattern, the sensitivity $E_c$, $E_0$, $E_0/E_c$, the resolution, the exposure margin and the pattern profile were evaluated in the same manner as in the Evaluation Method 1. The results are shown in Table 6.

EXAMPLE 6

A photoresist composition was prepared and evaluated in the same manner as in Example 5 except that triphenylmethanol (C1) was used instead of triphenylmethane. The results are shown in Table 6.

COMPARATIVE EXAMPLE 6

A photoresist composition was prepared and evaluated in the same manner as in Example 5 except that in Example 5, no triphenylmethane was used, and the compositional ratios were as shown in Table 5. The results are shown in Table 6.

COMPARATIVE EXAMPLE 7

A photoresist composition was prepared and evaluated in the same manner as in Example 5, except that triphenylsilanol (M) was used instead of triphenylmethane. The results are shown in Table 6.

COMPARATIVE EXAMPLE 8

A photoresist composition was prepared and evaluated in the same manner as in Example 5 except that 1,3,5-triphenylbenzene (N) was used instead of triphenylmethane. The results are shown in Table 6.

$E_0/E_c$ i.e. the ratio of the exposure $E_0$ required to finish with a predetermined dimension to the minimum exposure $E_c$ required for the pattern to be removed to the substrate, is regarded as an index for the removal margin, and for the production of semiconductors, the larger the ratio, the better, generally.

In Examples 5 and 6, $E_0/E_c$ is large, and the resolution is superior as compared with those in Comparative Examples 6 to 8.

TABLE 5

| | Component (A) | | Component (B) | | | | Additive | | Solvent | | |
|---|---|---|---|---|---|---|---|---|---|---|---|
| | Type | (parts by weight) | Type | (parts by weight) | Type | (parts by weight) | Type | (parts by weight) | (parts by weight) | $\frac{\text{Additive}}{\text{A + B + Additive}} \times 100$ (%) | |
| Example 5 | A6 | 1.218 | B2 | 0.317 | B3 | 1 | C2 | 0.026 | 8.11 | 1.0 | |
| Example 6 | A6 | 1.218 | B2 | 0.317 | B3 | 1 | C1 | 0.026 | 8.11 | 1.0 | |
| Comparative Example 6 | A6 | 1.244 | B2 | 0.317 | B3 | 1 | — | — | 8.11 | — | |
| Comparative Example 7 | A6 | 1.218 | B2 | 0.317 | B3 | 1 | M | 0.026 | 8.11 | 1.0 | |
| Comparative Example 8 | A6 | 1.218 | B2 | 0.317 | B3 | 1 | N | 0.026 | 8.11 | 1.0 | |

TABLE 6

| | $E_{th}$ (msec) | $E_c$ (msec) | $E_0$ (msec) | $E_0/E_c$ | $\frac{\Delta CD}{\Delta \log Exp.}$ | Resolution (μm) | Pattern profile |
|---|---|---|---|---|---|---|---|
| Example 5 | 254 | 310 | 581 | 1.87 | 0.66 | 0.30 |  |
| Example 6 | 249 | 270 | 494 | 1.83 | 0.84 | 0.30 |  |
| Comparative Example 6 | 248 | 320 | 512 | 1.60 | 0.91 | 0.34 |  |
| Comparative Example 7 | 246 | 320 | 511 | 1.60 | 0.97 | 0.32 |  |
| Comparative Example 8 | 246 | 340 | 495 | 1.46 | 0.65 | 0.34 |  |

COMPARATIVE EXAMPLE 9

A photoresist composition was prepared and evaluated in the same manner as in Example 5 except that 1,1,2,2-tetraphenyl-1,2-ethanediol was used instead of triphenylmethane.

In Comparative Example 9, bite at the interface between the wafer substrate and the photoresist pattern was large as compared with Examples 5 and 6, and a standing wave was observed at the side wall of the pattern.

We claim:

1. A photosensitive resin composition comprising an alkali-soluble resin (A), a compound (B) containing a 1,2-quinonediazide group, and a compound (C) of the following formula (I):

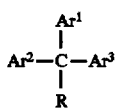
(I)

wherein each of $Ar^1$ to $Ar^3$, which are independent of one another, is phenyl, 1-naphthyl or 2-naphthyl which if substituted, is substituted only by one or more substituents selected from the group consisting of a halogen atom, a $C_{1-4}$ alkyl group and a $C_{1-4}$ alkoxy group, and R is a hydrogen atom, a hydroxyl group, a $C_{1-4}$ alkyl group or a $C_{1-4}$ alkoxy group.

2. The photosensitive resin composition according to claim 1, wherein the compound (C) is present in an amount of from 0.1 to 3 wt %, relative to the solids content of the photosensitive resin composition.

3. The photosensitive resin composition according to claim 2, wherein the compound (C) is present in an amount of from 0.4 to 1.5 wt %, relative to the solids content of the photosensitive resin composition.

4. The photosensitive resin composition according to claim 1, wherein R is a hydrogen atom or a hydroxyl group.

5. The photosensitive resin composition according to claim 1, wherein R is a hydrogen atom.

6. The photosensitive resin composition according to claim 1, wherein R is a hydroxyl group.

7. The photosensitive resin composition according to claim 1, wherein each of $Ar^1$ to $Ar^3$ is a non-substituted phenyl.

8. The photosensitive resin composition according to claim 1, wherein the 1,2-quinonediazide compound is a 1,2-quinonediazide sulfonate of a novolak resin having a weight average molecular weight of from 600 to 2200, or of a polyhydroxyl compound.

9. The photosensitive resin composition according to claim 1, wherein said alkali-soluble resin (A) is a novolak resin, a polyhydroxystyrene, a derivative thereof or a styrene-maleic anhydride copolymer.

10. The photosensitive resin composition according to claim 1, wherein the amount of alkali-soluble resin in the photosensitive resin composition ranges from 1–40 wt. %.

11. The photosensitive resin composition according to claim 10, wherein the amount of said alkali-soluble resin ranges from 10–30 wt. %.

12. The photosensitive resin composition according to claim 1, wherein the amount of said 1,2-quinonediazide compound in the resin composition ranges from 1–30 wt. %.

13. The photosensitive resin composition according to claim 12, wherein the amount of said 1,2-quinonediazide compound ranges from 5–20 wt. %.

14. A method for forming a photoresist pattern, which comprises coating a photosensitive resin composition on a substrate, followed by exposure and development, wherein the photosensitive resin composition comprises an alkali-soluble resin (A), a compound (B) containing a 1,2-quinonediazide group, and a compound (C) of the following formula (I):

wherein each of $Ar^1$ to $Ar^3$ which are independent of one another, is phenyl, 1-naphthyl or 2-naphthyl which, if substituted, is substituted only by one or more substituents selected from the group consisting of a halogen atom, a $C_{1-4}$ alkyl group and a $C_{1-4}$ alkoxy group, and R is a hydrogen atom, a hydroxyl group, a $C_{1-4}$ alkyl group or a $C_{1-4}$ alkoxy group.

15. The method according to claim 14, wherein the exposure is carried out with light having a wavelength of from 300 to 500 nm.

* * * * *